United States Patent [19]

Huet et al.

[11] Patent Number: 4,603,234
[45] Date of Patent: Jul. 29, 1986

[54] SWITCHING CIRCUIT INCLUDING CURRENT LIMITING AND INITIALIZING SIGNAL ISOLATION

[75] Inventors: John M. Huet, Lakewood; Frederick J. Kiko, Aurora, both of Colo.

[73] Assignee: GTE Lenkurt Incorporated, Phoenix, Ariz.

[21] Appl. No.: 481,552

[22] Filed: Apr. 4, 1983

[51] Int. Cl.⁴ ................... H03K 17/687; H03K 17/78
[52] U.S. Cl. ............................ 179/16 AA; 179/18 FA
[58] Field of Search ................ 179/175.3 F, 16 AA, 179/16 F, 18 FA, 16 EA, 90 K; 307/311

[56] References Cited

U.S. PATENT DOCUMENTS

| | | | |
|---|---|---|---|
| 3,958,175 | 5/1976 | Braun | 323/9 |
| 3,980,903 | 9/1976 | Jamée | 307/311 |
| 4,151,377 | 4/1979 | Whitaker | 179/84 R |
| 4,323,733 | 4/1982 | Ott et al. | 179/6.3 R |
| 4,323,799 | 4/1982 | King et al. | 307/571 |
| 4,413,193 | 11/1983 | Crockett | 307/311 |
| 4,567,329 | 1/1986 | Bailly et al. | 179/18 FA |

Primary Examiner—Gene Z. Rubinson
Assistant Examiner—R. Vaas
Attorney, Agent, or Firm—Russell A. Cannon

[57] ABSTRACT

The A and B leads of a telephone circuit are resistively connected to the drain and source of an FET switch having its gate connected to the emitter of an optoelectric transistor that is also resistively connected across these leads. The collector of a control transistor is also connected to the gate, with its base-emitter diode and emitter bias resistor connected across the source bias resistor for turning on the control transistor and limiting current in the FET when conduction of the latter exceeds a prescribed rate.

6 Claims, 2 Drawing Figures

4,603,234

SWITCHING CIRCUIT INCLUDING CURRENT LIMITING AND INITIALIZING SIGNAL ISOLATION

BACKGROUND OF INVENTION

This invention relates to a switching circuit which closes a power circuit; and more particularly to a switching circuit in which the initializing signal is isolated from the power circuit that is to be switched and where current limiting is provided in the switching circuit.

In most power circuits, the theory of controlling the closing and opening of a circuit is the same regardless of the magnitude of the voltage and currents to be switched. However, the techniques used in different circuit applications may vary considerably. The present invention is directed to the opening and closing of circuits which normally have relatively small current (in the order of 15–80 milliamperes) and relatively low voltage (in the order of 24 to 80 volts). Simple relay circuits may be used in many applications to effect the opening and closing of circuits in which voltages and currents of these magnitudes are present. More recently, switching transistors have been developed which will also switch powers of this magnitude. However, such transistor circuits do not readily permit the isolation of the initializing signal from the power circuit, nor do they include a current limiting arrangement for reducing the power which is permitted to pass through the closed power circuit. The requirement for isolation is important in circuits in which the longitudinal balance is to be maintained, and such a requirement is necessary for many communication circuits. The requirement for minimizing power consumption is important in present day electronic circuits, particularly where such circuits are under control of a microprocessor.

Although the present invention is described in relation to its application to a telephone signalling system, it is to be understood that the invention may be employed in many other applications and, therefore, is not to be limited to such applications, but only should be limited by the appended claims.

SUMMARY OF THE INVENTION

It is an object of this invention to provide a fully floating switch to prevent any adverse effect on the longitudinal balance of the switched circuit.

It is another object of this invention to limit the current in the switched circuit so as to reduce power dissipation.

Briefly, a preferred embodiment of the invention includes an isolation circuit means responsive to an initializing signal for providing an enabling voltage to a semiconductor switch means. Current limit means associated with said switching means and said isolation circuit means provides effective control of the current and hence power dissipation.

DESCRIPTION OF THE DRAWING(S)

FIG. 1 is a block diagram of a preferred embodiment of the invention in a telephone signalling environment in which a microprocessor 2 provides an initializing signal on line 4; and FIG. 2 is a graph which illustrates hard and soft limiting characteristics typical of those which may be obtained from a limiting circuit, such as employed in a preferred embodiment of the invention, which includes a strongly voltage dependent circuit operating in conjunction with a high resistant, voltage independent circuit.

DETAILED DESCRIPTION OF THE INVENTION

Figure 1:
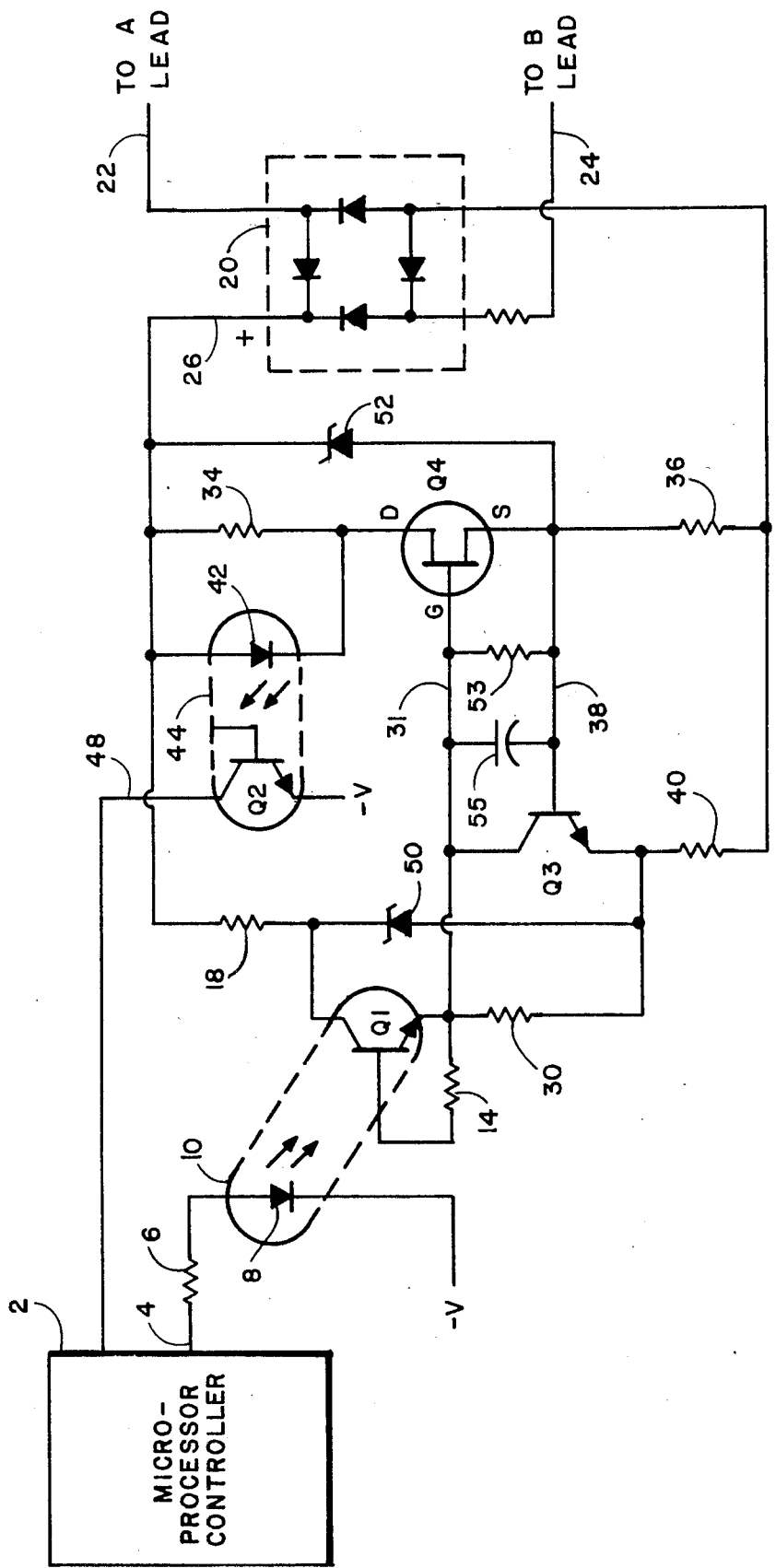

In referring to FIG. 1, it should be understood that the invention is shown in a telephone signalling circuit environment where it functions as a loop switch under the control of a microprocessor 2. Upon obtaining an initializing signal for path 4 from the output of microprocessor controller 2, the function of the switching portion of the circuit is to close the loop between paths 22 and 24 which are connected respectively to the A and B leads of a signalling relay and a central office battery in a telephone system application. When an initializing signal appears on path 4, it causes a current to flow through resistor 6 and light emitting diode 8, which is part of an optoelectronic circuit 10. Light from the diode 8 turns on the associated transistor Q1 which draws a small amount of current from the circuit to be switched. Collector current in Q1 is passed from the A lead through a diode bridge 20, which ensures that the polarity of path 26 is always positive, regardless of the polarity of the voltage that is applied on the inputs to the diode bridge, thence through resistor 18, the collector-emitter path of Q1, through resistors 30 and 40, and the B lead. Resistors 18, 30 and 40 then operate as a voltage divider with a node connected on line 31 to the drain of an FET switching transistor Q4. When there is sufficient current flowing through resistor 30, a positive bias voltage is developed on line 31 which turns on Q4. This closes the circuit between paths 22 and 24.

In order to limit the current in Q1 and protect it from excessive current and to prohibit any significant circuit adverse effects because of the current initially flowing through the circuit path comprising resistor 18, the collector-emitter path of Q1 and resistor 30, the resistor 30 is selected to have a very high resistance. This is necessary to prevent inadvertent operation of a relay which may be connected to the A and B leads. With Q1 turned on and current flowing through resistor 30, a positive bias voltage is developed between the gate and source of Q4. The resistors 34 and 36 are each low valued and thus the leads 22 and 24 are effectively connected together whereby the closure portion of the switching circuit is effected. And with the transistor Q3 cut off, Q4 can conduct hard.

Figure 2:
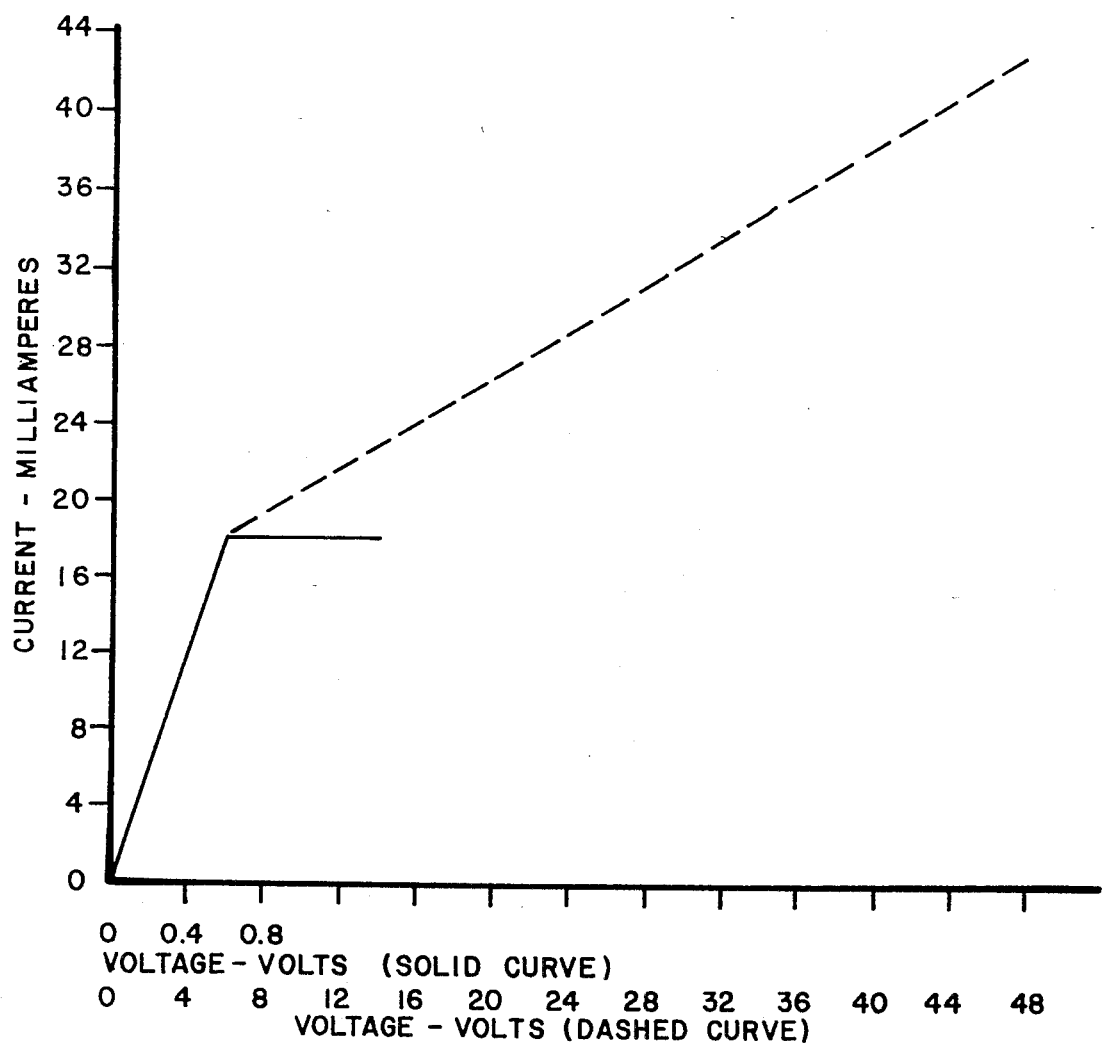

The current flow through Q4 passes through resistor 36 creating a bias voltage which is applied on line 38 to the base of Q3. When the current through resistor 36 becomes high enough, this voltage turns on Q3 which conducts through Q1 and, absent any other mitigating effects, when Q3 turns on then the Q4 gate to source bias voltage decreases in a manner which reduces conduction of Q4. This is because switching transistor Q4 is selected, for example, as an N-channel MOS FET which requires a positive voltage to turn it on, and a substantially zero voltage will turn it off. The switching transistor Q4 actually has a conduction threshold of about 2 volts. Thus, the turning on of Q3 will effect a cut off or decrease in the conduction rate of the switching transistor Q4. Absent any other effects, the presence of Q3 provides hard limiting of the current which would flow through the switched circuit. The solid lines in FIG. 2 show the current that would flow through switch Q4 as a function of line voltage that is applied when the resistance of resistor 36 is 33 ohms, the resistance of Q4 is approximately 8 ohms, and the resistance of resistor 34 is 240 ohms. When the current flowing through resistor 36 is high enough to develop a 0.6 volt bias potential on the Q3 base, it is turned on. There is an auxillary or counter-acting force, however, provided by conduction of Q3 through Q1 and resistor 40 which reduces the effect of the bias voltage developed in resistor 36 and by Q3 on the FET gate and which acts to soften the effect of the hard limiting caused only by the presence of Q3 and bias resistor 36. As Q3 turns on harder, the Q3 conduction current in R40 raises its emitter voltage which reduces its base-emitter potential and its conduction rate. This causes a gradual reduction in the conduction rate of the FET. Thus, there are two opposing forces at work here. Current flowing through resistor 36 tends to bias transistor Q3 into conduction, and at the same time current flowing through the path including resistor 40 tends to turn it off again. An equilibrium state of conduction in Q3 and Q4 is determined essentially by the resistances of resistors 18, 36 and 40 or their resistance ratio. As a result of this operation of Q3, the current flowing through the circuit or Q4 initially rises very rapidly as is shown in FIG. 2, until current reaches the hard limiting point, and then the effect of the other current path through resistor 10, Q1, Q3 and resistor 40 alters the current-voltage characteristic to be effectively that of resistor 40. This is shown as the dashed line in FIG. 2.

Stated differently, the main portion of current flows through switching transistor Q4 and resistor 36, and a minor portion flows through the alternate current path including resistor 18, Q1, path 31, Q3 and resistor 40. Current in the main path to Q4 is not voltage dependent. Current in the alternate path is voltage dependent, however, which means that as line voltage increases then the current limit tends to soften. This may be better understood by realizing that initially Q4 is turned on hard and its initial voltage-current characteristic looks like that of a pure resistance which is equal to that of resistors 34 and 36 and the drain to source resistance of Q4. Once the voltage across bias resistor 36 is sufficient to turn on Q3, then the Q4 current is strictly limited as indicated by the horizontal line in FIG. 2. At this point, however, the circuit begins to act more like a high resistance, such as the emitter resistor 40 associated with Q3, and the slope of the characteristic in FIG. 2 is significantly changed, which means that the current-voltage characteristic has stiffened, but it does not hard limit the current as would otherwise be obtained. It should be understood that the characteristics shown in FIG. 2 are illustrative only and the actual characteristics would vary depending upon the circuit application employed by the user as is well understood in the art.

In some circuit applications, it is possible to have Q4 closed by a small amount of current which would flow through Q1, providing the correct bias to Q4 without having normal current flow through the switching transistor. This can occur, for example, in a loop-circuit of a foreign exchange office (FXO) where the subscriber loop end is not closed.

To recognize the absence of current flow in the switched circuit, a second optoelectronic circuit 44 is employed in which the light emitting diode 42 thereof is connected across resistor 34 which is in series with the drain of Q4. Resistor 34 is selected so that the major portion of the current passes through light emitting diode 42 which clamps the voltage across resistor 34 to about one volt. The transistor Q2 is turned on which provides a control signal via path 48 to microprocessor 2 so long as current flows through Q4. Although it would appear that the processor would know that the current is flowing through Q4 because the initializing signal on 4 is transmitted therefrom, in a telephone signalling system the line might subsequently be disconnected causing the office to disconnect the circuit which interrupts the current flow, and such action would be independent from the information available in the microprocessor 2. It is clear that such current sensing arrangements could be effective in any number of circuits and thus should not be limited by the just described telephone signalling applications. In this case, an isolated current sensor is obtained for the small price of a single diode providing a one volt drop across resistor 34.

While the invention has been particularly shown and described with reference to a preferred embodiment thereof it will be understood by those skilled in the art that change in form and detail may be made therein without departing from the spirit and scope of the invention. By way of example, the diode bridge 20 and polarities of line voltages may be reversed, and the FET may be a P-channel device. And Q3 may be a PNP transistor. Also, the function of bridge 20 may be provided by an appropriately connected and biased FET. In the circuit of FIG. 1, the diodes 50 and 52 are 75 volt and 275 volt Zener diodes for protecting associated transistors Q1 and Q4. And the resistor 53 and capacitor 55 are connected across the Q4 gate to source junction for draining charge from the interelectrode capacitance there. This function may also be accomplished without resistor 53 and capacitor 55 by connecting the anode of diode 50 to the other side of resistor 40.

What is claimed is:

1. Apparatus for selectively connecting a positive terminal and a negative terminal so as to effect an opening and a closing of a circuit connected therebetween and for limiting current therethrough, said apparatus comprising:

means for producing an initializing signal;
   isolating means responsive to said initializing signal for generating a bias signal, said isolating means comprising:
      a first optoelectronic circuit responsive to said initializing signal for producing an optical signal, said circuit having an output transistor of the NPN type with a collector and an emitter defining a collector-emitter path, a first bias resistor having one end connected to said emitter and the other end connected to said negative terminal, said collector being electrically connected to said positive terminal, said transistor being responsive to said optical signal for changing from a nonconducting to a conducting state whereby current flow through said first resistor creates a bias voltage for maintaining said transistor in a conducting state;
   switching means responsive to said bias voltage for interconnecting said terminals, said switching means comprising a field effect transistor having drain, gate and source electrodes, said drain and source electrodes being connectable to said positive and negative terminals, respectively, said gate electrode being connected to said emitter of said output transistor whereby current flow in said collector-emitter path of the output transistor provides a bias voltage to said gate to turn on said field effect transistor;

current limiting means comprising:

a third transistor having base, emitter and collector electrodes, said base and collector electrodes being connected to said source and gate electrodes, respectively, of said field effect transistor, a second bias resistor having one end connected to the emitter of said third transistor and the other end connected to said negative terminal; and a third bias resistor serially connected in the drain-source electrode path of said field effect transistor and having one end connected to said base electrode of the third transistor and the other end connected to said negative terminal, said third resistor being responsive to current flow in the drain-source electrode path of the field effect transistor for generating a proportional bias voltage operative to limit current flow through said third transistor and accordingly between said terminals.

2. Apparatus as set forth in claim 1 wherein current flow through said output transistor passes through said third transistor and said second bias resistor so as to reduce the biasing effect of current in said third bias resistor on conduction of said field effect transistor, whereby the current flowing through said field effect transistor is allowed to continue to rise as a function of terminal voltage, but at a different rate.

3. Apparatus as set forth in claim 2 including a sensing resistor serially connected between said drain and said positive terminal, a second optoelectronic device having an electrical input connected across said sensing resistor and in response to current flow therethrough for optically providing a current sensing control signal input to said microprocessor.

4. In a telephone signalling system having A and B leads and which utilizes a microprocessor to provide appropriate low voltage signals for effecting designated signalling functions, apparatus for closing a circuit path between said A and B leads and thereby effecting a loop-switching function, comprising:

means connected to said leads for maintaining positive and negative polarities of said leads, respectively;

an optoelectronic isolating circuit having an input connected to said microprocessor and having an NPN-type output transistor with a collector and an emitter defining a collectoremitter current conducting path, a first bias resistor serially connected in said path, said output transistor being responsive to a control signal from said microprocessor for changing from a nonconducting to a conducting state whereby current in said path passes through said first resistor and produces a bias voltage, said first resistor having one end connected to said emitter of said output transistor and having the other end connected through said polarity maintaining means to one of said leads having the negative polarity;

a field effect transistor having drain, gate and source electrodes, said drain and source electrodes be operatively connected through said polarity maintaining means to said A and B leads, respectively, said gate electrode being connected to said emitter of said output transistor whereby the field effect transistor is responsive to the bias voltage produced by said first resistor for switching between conducting and nonconducting states and controlling the desired loop switching function, a second bias resistor having one end connected to said source electrode of said field effect transistor and having the other end connected through said polarity maintaining means to said lead with the negative polarity; and a third transistor having base, emitter and collector electrodes, said base and collector electrodes of said third transistor being connected to said source and gate electrodes, respectively, of said field effect transistor, a third bias resistor having one end connected to said emitter of said third transistor and the other end connected through said polarity maintaining means to said lead having the negative polarity, said base of said third transistor being connected to said one end of said second resistor.

5. Apparatus as set forth in claim 4 wherein current flow through said output transistor passes through said third transistor and said third bias resistor so as to reduce the biasing effect of current in said second bias resistor on said third transistor, whereby the current flowing through said field-effect transistor is allowed to continue to rise, but at a different rate, when the voltage appearing across said positive and negative terminals increases in value.

6. Apparatus as set forth in claim 5 including a sensing resistor serially connected between said drain and said positive power path, a second optoelectronic device having an electrical input connected across said sensing resistor and in response to current flow therethrough, providing a current sensing control signal input to said microprocessor control.

* * * * *